(12) United States Patent
Araki

(10) Patent No.: US 6,831,340 B2
(45) Date of Patent: Dec. 14, 2004

(54) SURFACE ACOUSTIC WAVE DEVICE AND METHOD OF PRODUCING THE SAME

(75) Inventor: Nobushige Araki, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/271,780

(22) Filed: Oct. 17, 2002

(65) Prior Publication Data

US 2003/0080649 A1 May 1, 2003

(30) Foreign Application Priority Data

Oct. 17, 2001 (JP) .................................. 2001-319843
Sep. 10, 2002 (JP) .................................. 2002-264163

(51) Int. Cl.⁷ .............................................. H01L 29/82
(52) U.S. Cl. ..................... 257/416; 257/254; 438/50; 438/52; 438/53; 333/193
(58) Field of Search .......................... 257/254, 416; 438/50, 52, 53

(56) References Cited

U.S. PATENT DOCUMENTS

| | | | |
|---|---|---|---|
| 5,869,149 A | | 2/1999 | Denison et al. |
| 5,920,143 A | * | 7/1999 | Tarui et al. ............ 310/313 A |
| 6,071,832 A | | 6/2000 | Ishikawa |
| 6,078,229 A | * | 6/2000 | Funada et al. .............. 333/193 |
| 6,222,299 B1 | * | 4/2001 | Graebner et al. ....... 310/313 R |

FOREIGN PATENT DOCUMENTS

| | | | | |
|---|---|---|---|---|
| CN | 1215912 | A | 5/1999 | |
| JP | 5-055854 | | 3/1993 | |
| JP | 7-058096 | | 3/1995 | |
| JP | 7-135440 | | 5/1995 | |
| JP | 8-045926 | | 2/1996 | |
| JP | 09-260366 | | 10/1997 | |
| JP | 10-030179 | | 2/1998 | |
| JP | 10-135766 | | 5/1998 | |
| JP | 10-270423 | | 10/1998 | |
| JP | 2001-015698 | | 1/2001 | |
| JP | 2001085157 | A * | 3/2001 | ........... H05B/33/04 |
| JP | 2001-085964 | | 3/2001 | |

OTHER PUBLICATIONS

Takao Amazawa et al., "Deposition of High Quality Thin Films Using ECR Plasma", vol. 66, No. 4, 2000, pp. 511–516.

* cited by examiner

Primary Examiner—David Nelms
Assistant Examiner—Andy Huynh
(74) Attorney, Agent, or Firm—Keating & Bennett, LLP

(57) ABSTRACT

A surface acoustic wave device includes a piezoelectric substrate and interdigital electrode portions disposed on the piezoelectric substrate. A functional film including at least one of a silicon nitride film, a silicon oxide film, and a silicon oxide nitride film is formed on the piezoelectric substrate having the interdigital electrode portions such that the functional film is formed on at least a portion of the interdigital electrode portions by an electron cyclotron resonance sputtering method.

9 Claims, 9 Drawing Sheets

SURFACE ACOUSTIC WAVE DEVICE AND METHOD OF PRODUCING THE SAME

BACKGROUND OF THE INVENTION

1. Field of the Invention

The present invention relates to a surface acoustic wave device having a thin film made of at least one of a silicon nitride film (SiN film), a silicon oxide film (SiO film), and a silicon oxide nitride film (SiON film) and also relates to a method of manufacturing such a surface acoustic wave device.

2. Description of the Related Art

SiN films, SiO films, and SiON films have been widely used in surface acoustic wave devices (hereinafter, referred to as a SAW device). For example, these films are used as functional films for finely adjusting the frequencies of SAW devices, protecting the devices to improve the weather resistances thereof (moisture-proofing films), improving the temperature characteristics thereof, etc. These functional films determine the performances of the SAW devices. Thus, the manufacture of these films is required to be stable and highly-reproducible.

In recent years, to cope with the reduction in size and weight of SAW devices, resin materials such as epoxy resin have been more frequently used as parts of packages for SAW devices. The resin materials are water-permeable. Accordingly, in the above-described use, water which permeates through a resin material portion of such packages causes an interdigital electrode portion (hereinafter, referred to as IDT), which is generally made of an Al material, to be corroded. This deteriorates the characteristics of the SAW device.

Therefore, protection-film formation techniques for improving the moisture-proof property have been more important. Regarding methods for forming such films, methods that are generally called sputtering methods such as RF sputtering, DC sputtering, RF magnetron sputtering, and other such methods are used for forming the SiO films. The SiN films and the SiON films are formed by a plasma-CVD (chemical Vapor Deposition) method (hereinafter, briefly referred to as P-CVD) and other suitable methods.

However, when the above-described thin films are formed as functional films on the chips (IDTs on piezoelectric substrates) of SAW devices, respectively, problems are caused in that the electrical characteristics of the SAW devices are deteriorated. Especially, increases in the insertion loss is one of the reasons why the film thicknesses can not be increased. For example, if a protection film having a film-thickness at which the insertion loss is allowable is formed as a functional film, problematically, the protection film will be insufficient as a functional film for improving the moisture-proof property.

For example, when an SiN film with a thickness of 10 nm is formed on a SAW filter by a P-CVD method to improve the moisture-proof property of the filter, the insertion loss is increased by about 0.3 dB. The increased insertion loss is caused by the fact that the SIN film formed by the P-CVD method is not tight.

Furthermore, in the case of lithium niobate (LiNbO$_3$) used for a piezoelectric substrate of a SAW device, the temperature of the piezoelectric substrate can not be increased when the film is formed. Accordingly, the P-CVD method for film-formation which requires heating at a temperature of about 300° C. to 400° C. cannot be applied to the piezoelectric substrate made of LiNbO$_3$.

SUMMARY OF THE INVENION

In order to overcome the problems described above, preferred embodiments of the present invention provide a SAW device having as a functional film at least one of an SiN film, an SiO film, and an SiON film, by which the characteristics of the SAW device are prevented from being deteriorated, the film having a tight structure, and also provide a method of manufacturing the SAW device by which the functional film can be reliably formed.

According to a first preferred embodiment of the present invention, a surface acoustic wave device includes a piezoelectric substrate, interdigital electrode portions disposed on the piezoelectric substrate, a functional film including at least one of a silicon nitride film, a silicon oxide film, and a silicon oxide nitride film and disposed on at least a portion of the interdigital electrode portions, and a package including the piezoelectric substrate having the interdigital electrode portions and the functional film, at least a portion of the package being made of a moisture-permeable material, the functional film being formed by an electron cyclotron resonance sputtering method (hereinafter, the electron cyclotron resonance is referred to as ECR).

Preferably, the package including the piezoelectric substrate having the interdigital electrode portions and the functional film defines a structure in which the piezoelectric substrate mounted by a flip-chip bonding method, and the piezoelectric substrate is sealed with a moisture-permeable resin.

Also, preferably, the functional film is formed at a room temperature.

The functional film, which is preferably formed by an ECR sputtering method, has a tight-structure, so that the weather resistance is reliably improved. Moreover, according to the ECR sputtering method, heating of the substrate is not required for formation of the functional film. For example, the functional film can be formed at a room temperature. Thus, preferred embodiments of the present invention may be also applied to an LiNbO$_3$ substrate of which the characteristics will be deteriorated by heating. Furthermore, the pyroelectric breakdown of the piezoelectric substrate, which may be caused by heating of the IDT, is reliably prevented.

The resistance to environmental conditions of the device is greatly improved according to preferred embodiments of the present invention. Thus, a material which is inexpensive and can be reduced in size, but is moisture-permeable such as epoxy resins or other suitable material can be used, e.g., for at least a portion of the package. Thus, the time-dependent deterioration of the characteristics of the device, which may be caused by permeated water, is reliably prevented. Moreover, the cost of the device is reduced.

In some cases, adhesion of an SiN film to a piezoelectric substrate is inferior to that of an SiO film, due to the difference between the coefficients of linear expansion thereof. Thus, according to another preferred embodiment of the present invention, the functional film includes the silicon nitride film, and the nitrogen concentration is changed in the film-thickness direction. More preferably, for the functional film having a nitrogen concentration changed as described above, the nitrogen concentration on the front surface side is larger than that on the interdigital electrode portion side. Also, preferably, in the functional film, the SiN film is provided on the front surface side, and the SiO film is located on the IDT side.

Improvements to the moisture-proof property and that of the adhesion to the piezoelectric substrate can be achieved by changing the nitrogen concentration of the functional film including an SiN film in the film-thickness direction, for example, by setting the nitrogen concentration in such a manner that the concentration on the front surface side is larger than that on the IDT side.

Preferably, the functional film includes the silicon nitride film, and the silicon nitride film preferably has a film-thickness of about 3 nm or greater, and the film thickness is preferably about 2.0% or less of the wavelength of a surface acoustic wave generated in the interdigital electrode portions.

Accordingly, a high moisture-proof property is reliably achieved.

Also, preferably, the functional film includes a silicon oxide film in the lowermost layer (on the IDT side), a silicon oxide nitride film in an intermediate layer, and a silicon nitride film in the uppermost layer.

The intermediate layer may have a multi-layer structure in which at least one silicon nitride film and at least one silicon oxide film are laminated to each other.

According to the above-described structure including the SiN film in the uppermost layer, a high moisture-proof property is reliably achieved.

To solve the above-described problems, according to another preferred embodiment of the present invention, a surface acoustic wave device includes a piezoelectric substrate, interdigital electrode portions disposed on the piezoelectric substrate, a functional film including a silicon nitride film and disposed on at least a portion of the interdigital electrode portions by an electron cyclotron resonance sputtering method, and a package including the piezoelectric substrate having the interdigital electrode portions and the functional film, at least a portion of the package being made of a moisture-permeable material, the functional film having a nitrogen concentration that varies in the film-thickness direction.

In this surface acoustic wave device, improvement of the moisture-proof property and that of the adhesion to the piezoelectric substrate are also achieved, similarly to the above-described surface acoustic wave device according to the first preferred embodiment of the present invention.

A silicon oxide film for frequency-adjustment may be disposed on the functional film. With the silicone oxide film, the frequency of the IDT on the piezoelectric substrate can be finely adjusted while the resistance to environmental conditions is not deteriorated.

To solve the above-described problems, according to a third preferred embodiment of the present invention, a method of manufacturing a surface acoustic wave device which includes interdigital electrode portions on a piezoelectric substrate including the step of forming a functional film for improving the resistance to environmental conditions of the device including at least one of a silicon nitride film, a silicon oxide film, and a silicon oxide nitride film on at least a portion of the interdigital electrode portions by an ECR sputtering method.

By the above-described method, the functional film including at least one film made of SiN, SiO, and SiON which is tight and has a high purity can be formed, due to the use of the ECR sputtering method. Thus, a SAW device can be provided, in which deterioration of the characteristics is prevented, which may be caused when other methods are used. Moreover, for such SAW devices that cannot be film-formed with SiN, SiO, and SiON by a prior art method, the film-formation is enabled. A SAW device having a high reliability and improved characteristics is provided.

Especially, for SAW devices which have been used in recent years and of which a portion of the packages are made of a moisture-permeable material, SiN films or other suitable films can be formed without deterioration of the characteristics. Thus, a SAW device which has superior electrical characteristics, a high reliability, and is inexpensive is reliably provided.

Other features, elements, characteristics and advantages of the present invention will become more apparent from the following detailed description of preferred embodiments thereof with reference to the attached drawings.

DETAILED DESCRIPTION OF PREFERRED EMBODIMENTS

Figure 1A:
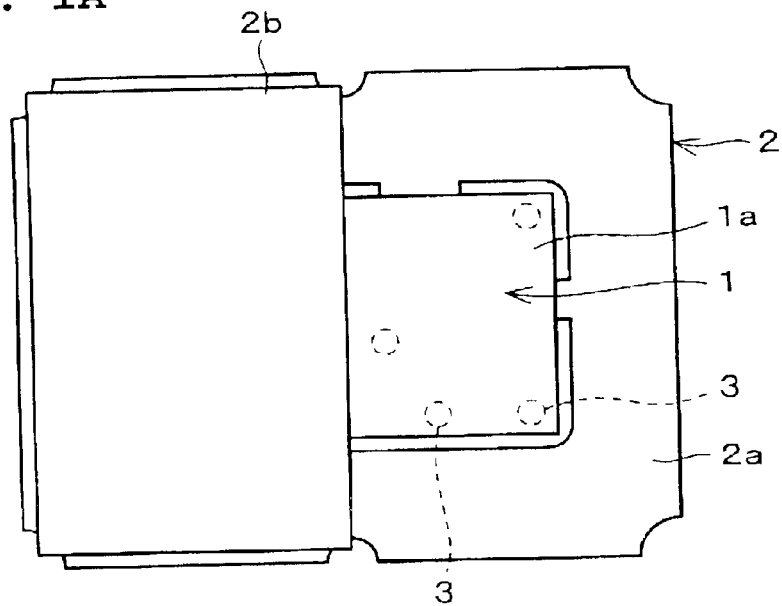
FIG. 1A is a partially cutaway plan view of a portion of a SAW device according to a preferred embodiment of the present invention.
Figure 1B:
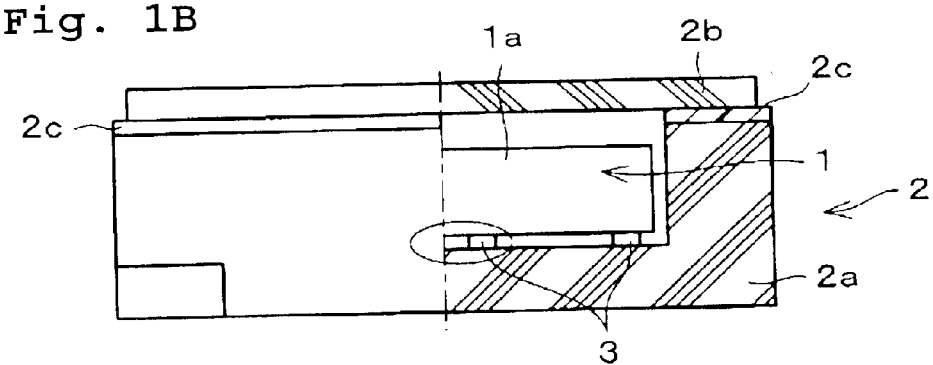
FIG. 1B is a partially cutaway elevational view of the portion of the SAW device shown in FIG. 1A.
Figure 1C:
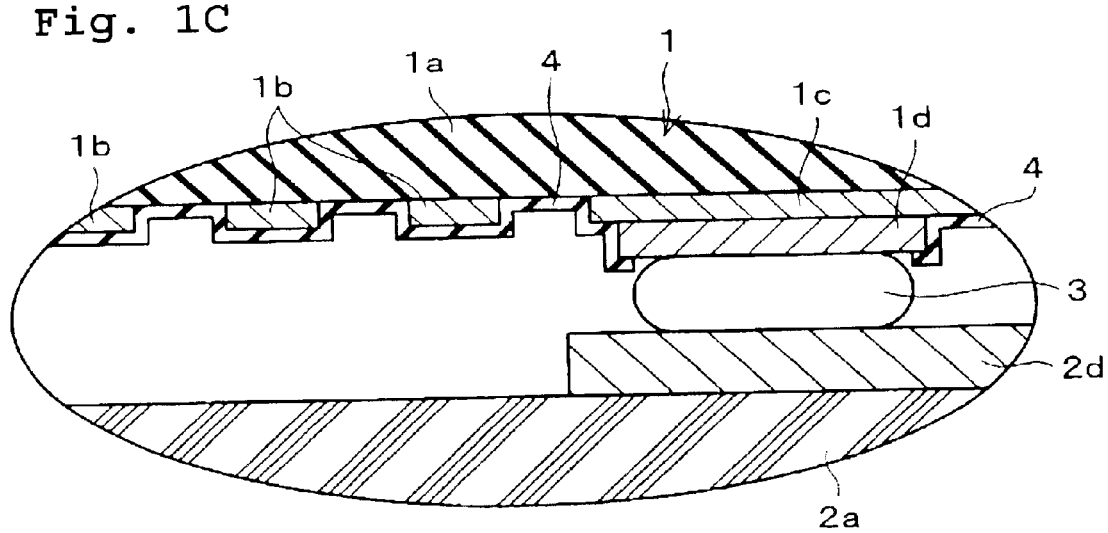
FIG. 1C is an enlarged sectional view of the portion of the SAW device shown in FIG. 1A.

Hereinafter, preferred embodiments of the SAW device of the present invention will be described with reference to FIGS. 1 to 9. According to a first preferred embodiment, an SAW filter 1 is included in a package 2 as shown in FIG. 1.

In the SAW filter 1, at least two IDTs (interdigital electrode portions) 1b and input-output terminals 1c for the IDTs 1b are disposed on a piezoelectric substrate 1a that is preferably made of 40±50° Y cut X propagation LiTaO$_3$, using aluminum copper electrodes (foil) according to photolithography process or other suitable process.

The IDTs 1b include two electrode finger portions each having a belt-shaped base-end (bus bar) and a plurality of electrode fingers extending from one side of the base-end substantially perpendicularly to the base-end so that the electrode fingers are substantially parallel to each other, the electrode fingers of one electrode finger portion being meshed with those of the other electrode finger portion in such a manner that the side portions of the electrode fingers of the one electrode finger portion are opposed to those of the other electrode finger portion, respectively.

The signal conversion characteristic and the pass-band of the above-described IDTs 1b can be selected by setting the length and width of the respective electrode fingers, the interval between adjacent electrode fingers, and the meshing width which means a length over which electrode fingers in the meshed state are opposed to each other. Moreover, in the SAW filter 1, a pad layer 1d for securing bump-bonding which will be described below is preferably provided on each input-output terminal 1c, using a conductor. The package 2 includes a bottomed box-shaped body 2a made of a ceramic such as alumina or other suitable material, a plate-shaped ceramic lid 2b as a cap for covering the opening of the body 2a to seal the body 2a, and an adhesive portion 2c for bonding the ceramic lid 2b to the body 2a. An epoxy resin is used for the adhesive portion 2c. Accordingly, a portion of the package of the SAW device, which is preferably made of the epoxy resin, is moisture-permeable.

Inner terminals 2d preferably made of Au are disposed on the inner surface of the body 2a in the positions thereof where the inner terminals 2d are opposed to the input-output terminals 1c, respectively, when the SAW filter 1 is attached to the body 2a by bump-bonding using bumps 3 of Au.

Furthermore, in the SAW device, an SiN film 4 as a protection film (functional film) is formed by an ECR sputtering method so as to cover the surfaces of the IDTs 1b, the input-output terminals 1c, the pad layers 1d, and the piezoelectric substrate 1a on which these components are formed, the surface excluding the location thereof for the bump-bonding.

When the package 2 is resin-sealed, or a plastic package is used for cost-saving and elimination of leads, the SiN film 4 is used to improve the moisture-proof property for the electrodes (IDTs or the like) in the SAW filter 1.

For an SiN film formed by the P-CVD method under general conditions, at least an approximately 10 nm film-thickness is required for the film to have a sufficient moisture-proof property (in this case, evaluated by a moisture-proof loading test in which a load of about 6V is applied at about 60° C. and a relative humidity of about 90% to about 95%).

However, when the film-formation is carried out by the P-CVD method, the characteristics of the SAW device are considerably deteriorated. For a ladder type filter operating in a 2 GHz band, an insertion loss of about 3 dB is caused compared to a SAW device having no such a film formed therein. The insertion loss of about 3 dB is significantly large for the SAW device used in an RF band. This insertion loss can not be prevented even if the design of the electrodes is improved.

Hereinafter, formation of the SiN film 4 using an ECR sputtering apparatus will be described. The principle of the ECR sputtering apparatus (typically, a solid-source ECR plasma film-forming apparatus, manufactured by NTT AFTY Corporation) will be described (see Amasawa, et al; "On High Quality Thin-Film Formation Using ECR Plasma", The Japan Society for Precision Engineering, Vol. 66., No. 4, P. 511 to 516 (2000) for the details of the ECR sputtering apparatus).

When a microwave of which the frequency is the same as that of the cyclotron is applied to an electron under cyclotron movement (revolution movement) in a magnetic field, resonance is caused. This is called electron-cyclotron-resonance (ECR).

Figure 2:
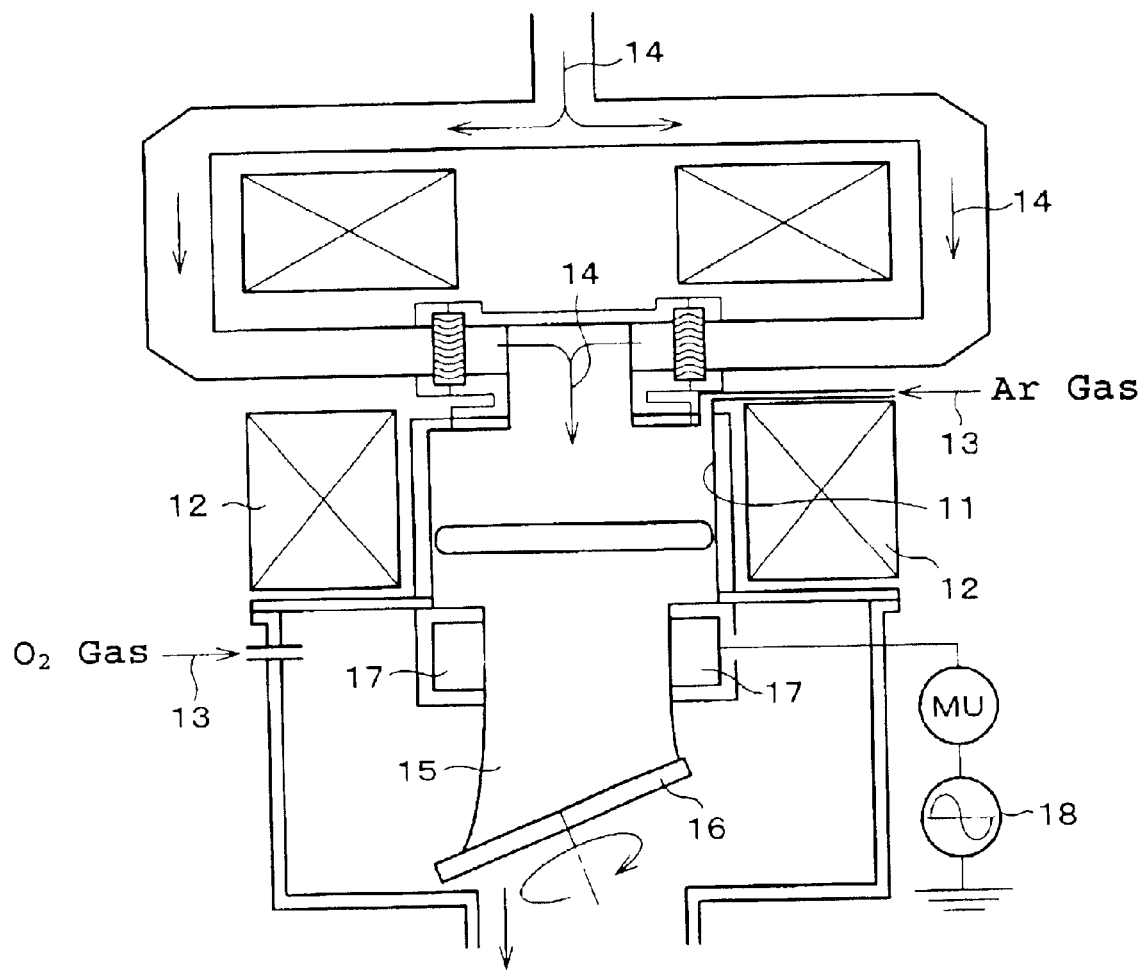
FIG. 2 is a schematic view showing the structure of an ECR sputtering apparatus for use in the process of producing the SAW device.

By the ECR, the electron can be efficiently accelerated, so that high density plasma can be generated. FIG. 2 shows a typical example of the ECR sputtering apparatus (FIG. 2 is a schematic view of the aforementioned apparatus manufactured by NTT AFTY Corporation).

The film-forming process is carried out as follows. A magnetic filed is generated through a magnetic coil disposed in the periphery of a plasma chamber 11 to provide ECR conditions. In this state, gas 13 is introduced into the plasma chamber 11, and a microwave 14 is applied, so that plasma is generated. This plasma is guided in the form of a plasma stream 15 to reach a substrate 16.

Characteristically, in this apparatus, a solid source as a target 17 is arranged around the plasma stream 15. The apparatus has such a function that an RF power 18 can be applied, e.g., at about 13.56 MHz. The respective elements of the solid source sputtered with the plasma stream 15 can be formed into a film on the substrate 16.

When Si is used as the solid source, and Ar and $N_2$ are used as a gas to be introduced, an SiN film is formed on the substrate. When Ar and $O_2$ are used, an SiO film is formed. Moreover, when Ar, $N_2$, and $O_2$ are used, an SiON film is formed.

For RF sputtering or vapor deposition, heating of a substrate is required. As described in the present preferred embodiment, for the ECR sputtering method, heating of the substrate is not required. The film-formation can be carried out at room temperature. Moreover, the Si solid source is produced by slicing an Si crystal. Therefore, a solid source having substantially no impurities can be produced. As a result, a film having a high purity can be formed.

The SiN film 4 was formed in the experiment described below. Thus, a solid source was prepared by slicing and processing an Si single crystal. The film-formation was carried out under the following conditions.

TABLE 1

| Items | Film-forming condition |
| --- | --- |
| Ar gas flow rate | 40 sccm |
| $N_2$ gas flow rate | 10 sccm |
| Pressure at film-forming | $1.7 \times 10^{-1}$ Pa |
| Microwave and RF power | 500/500 |
| Heating of substrate | No heating of substrate |
| Film-thickness | 10 nm |
| Film-forming rate | 3 nm/min. |

Figure 3:
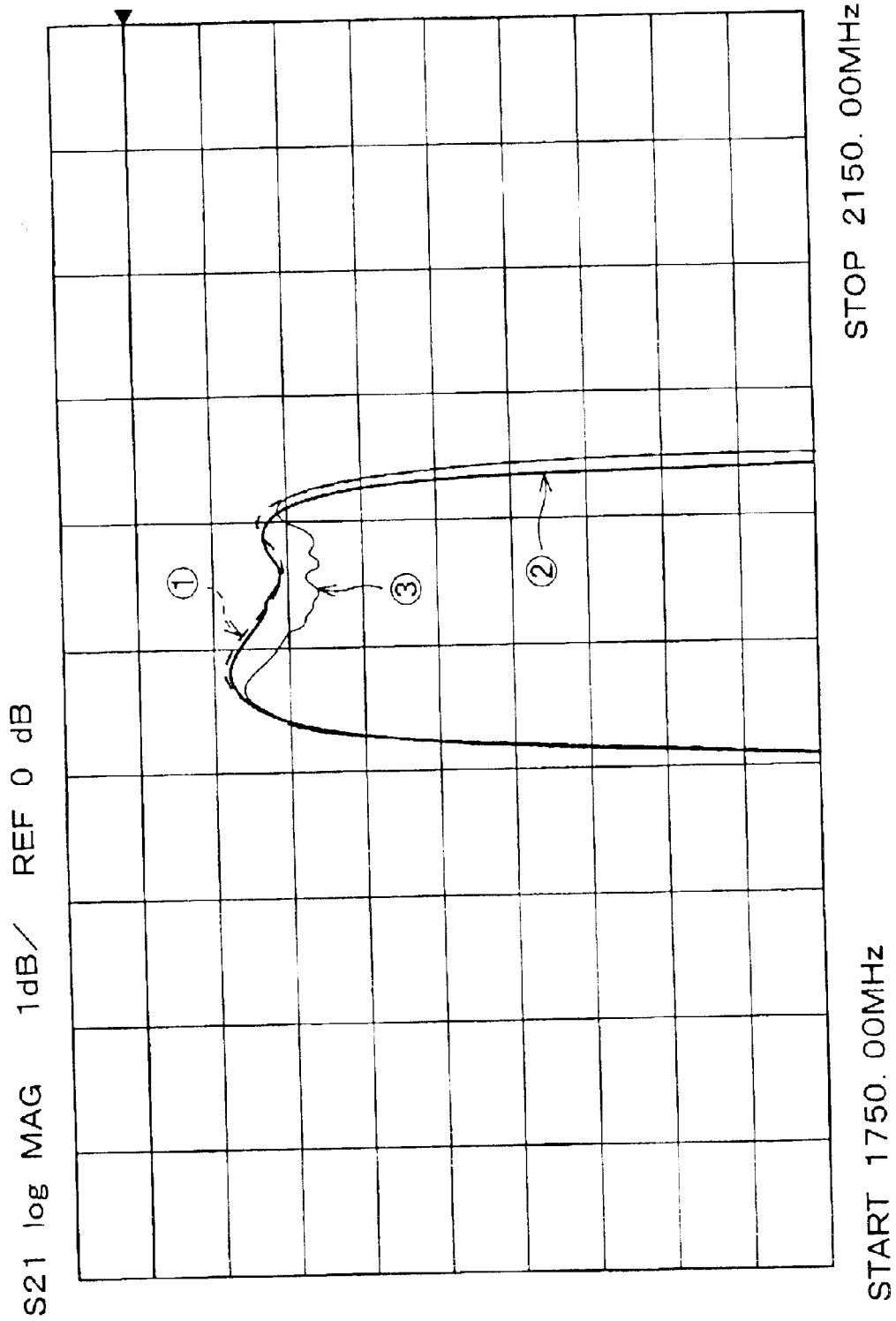
FIG. 3 is a graph showing the frequency-insertion loss characteristics of the SAW device as a SAW filter of a preferred embodiment of the present invention, a SAW filter of the related art, and a SAW filter having no SiN film as the functional film.

FIG. 3 shows the filter characteristics of SAW filters provided with SiN films each having a film-thickness of about 10 nm produced by the ECR sputtering method (shown by curve 2 in FIG. 3) under the above-described conditions and by the P-CVD method (by curve 3 in FIG. 3).

Figure 4A:
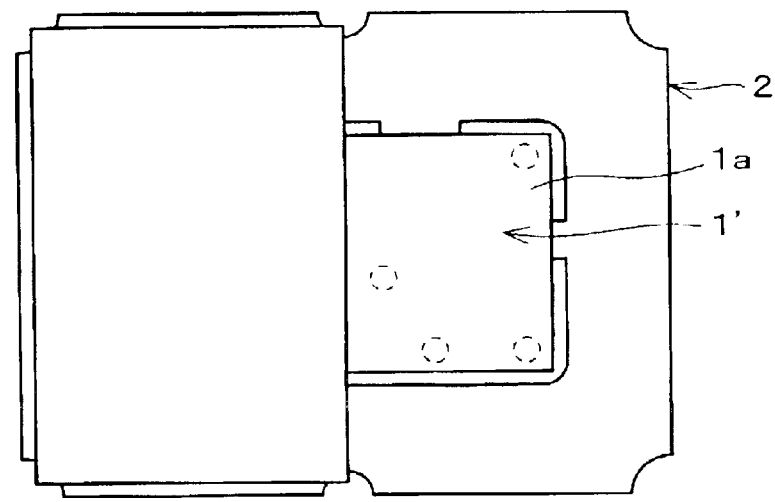
FIG. 4A is a partially cutaway plan view of a portion of the SAW device having no SiN film.
Figure 4B:
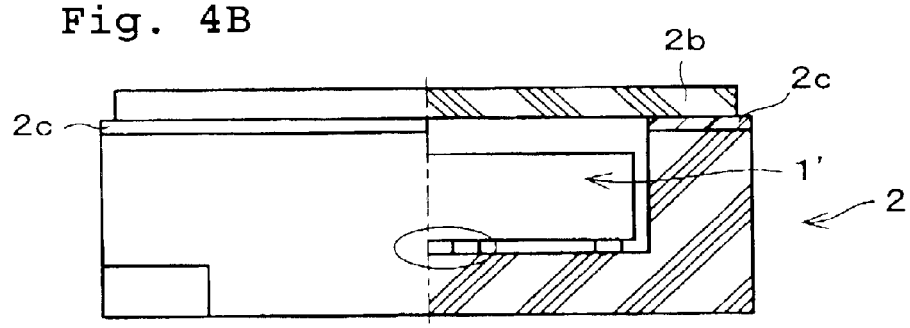
FIG. 4B is a partially cutaway elevational view of the portion of the SAW device having no SiN film as shown in FIG. 4A.
Figure 4C:
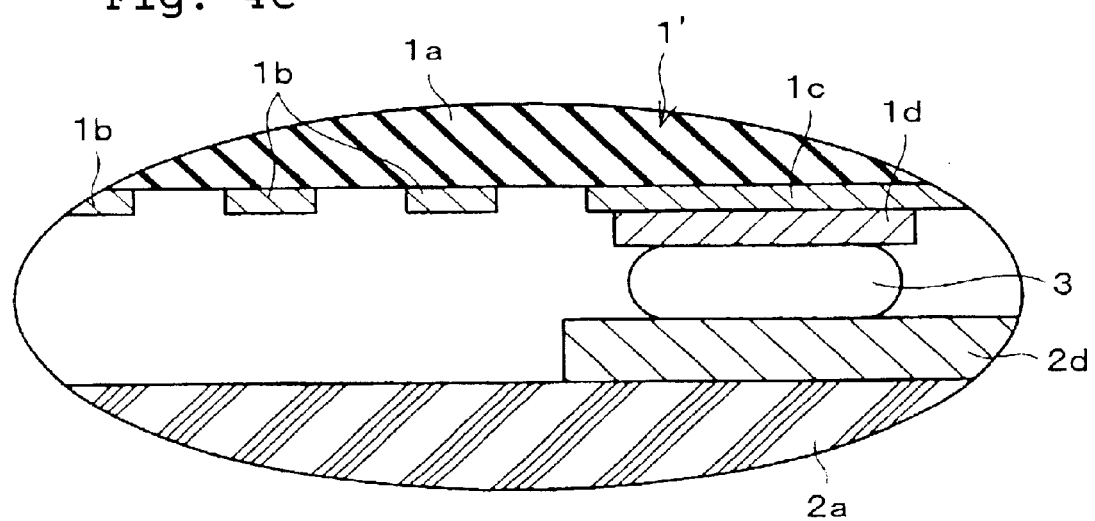
FIG. 4C is an enlarged sectional view of the portion of the SAW device having no SiN film as shown in FIG. 4A.

As seen in FIG. 3, substantially no deterioration of the insertion loss is caused for the SAW filter having the SiN film formed under the above-described conditions by the ECR method, in contrast to the SAW filter (shown by curve 1 in FIG. 3) having no film formed therein. As shown in FIG. 4C, the SAW filter 1' having no film formed therein is the same as the SAW filter 1 shown in FIG. 1C except that the SiN film 4 is not formed.

Figure 5:
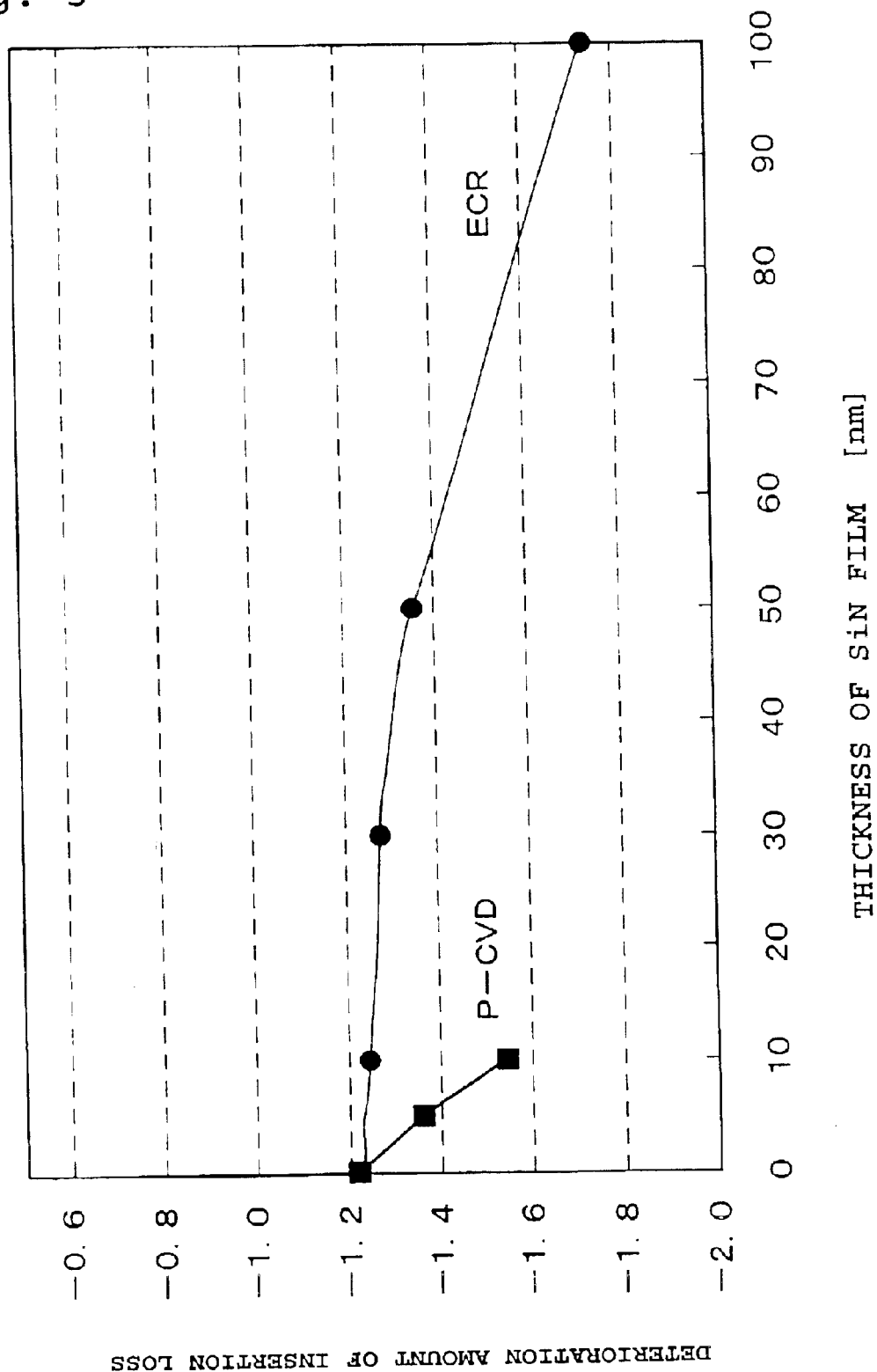
FIG. 5 is a graph showing relationships between the film-thicknesses and the insertion losses of the SAW device as a SAW filter of a preferred embodiment of the present invention and the SAW filter of the related art.

FIG. 5 shows the dependence of the insertion losses of SAW filters on the film-thicknesses thereof, the filters having SiN films formed by the P-CVD method and the ECR sputtering method. As seen in the results of FIG. 5, deterioration of the characteristic of the SAW device having the SiN film 4 formed by the ECR sputtering method and using the film 4 as a protection film is prevented.

Moreover, as understood in the results of FIG. 5, the upper limit of the film-thickness of the SiN film 4, determined from the standpoints of deterioration of the characteristic of the SAW device, is about 30 nm (in this example, the lithium tantalate substrate is used and the SAW filter is a 2 GHz band filter. Thus, the value of 30 nm is equivalent to 2.0% of the center wavelength of the surface acoustic wave (SAW)).

Figure 6:
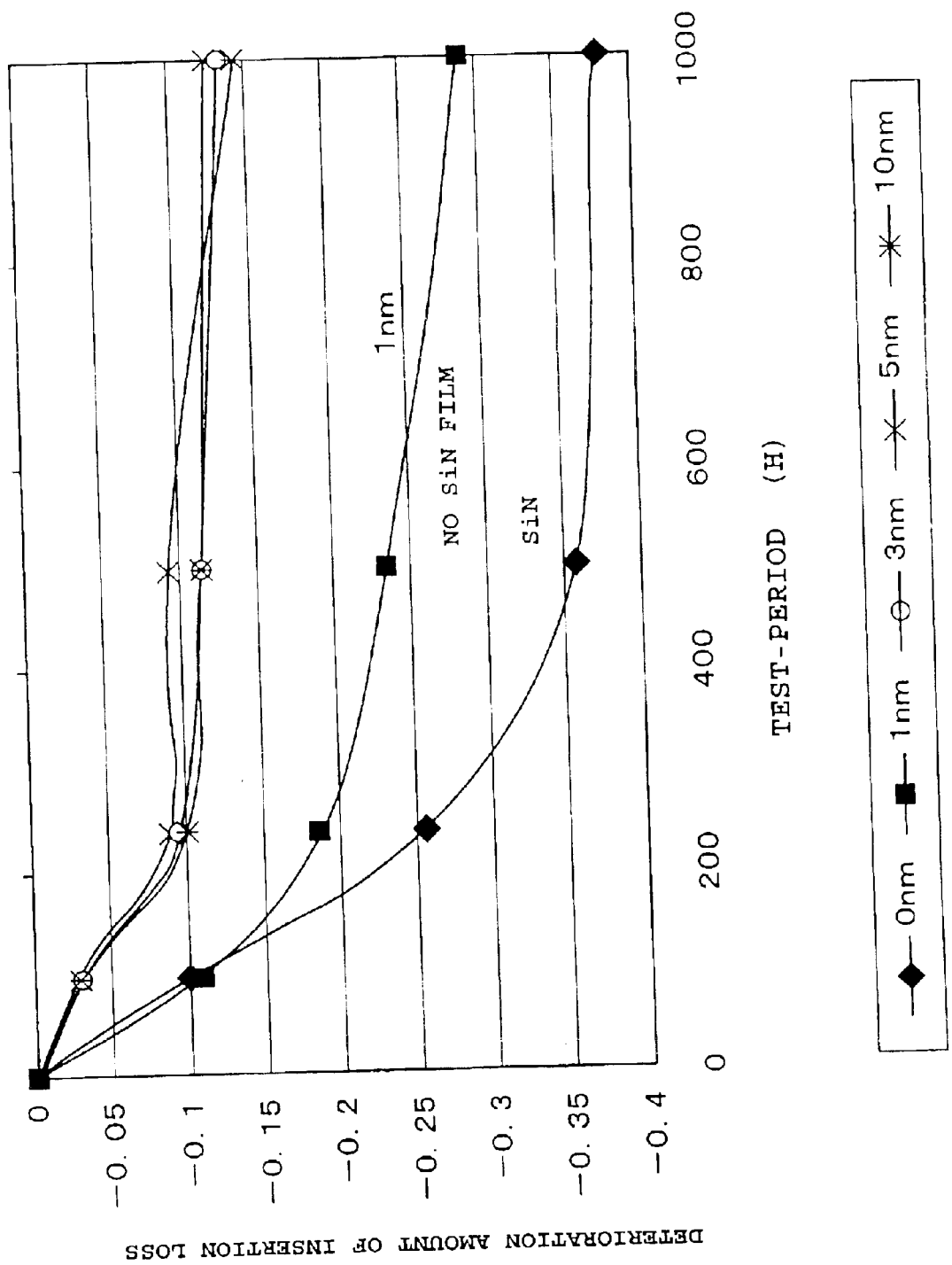
FIG. 6 is a graph showing relationships between the time-dependent film-thickness of an SiN film provided in the SAW device as a SAW filter and the time-dependent insertion loss.

FIG. 6 shows the results of the moisture-proof test of SiN films formed by the ECR sputtering method (the film-thicknesses of about 1 nm, about 3 nm, about 5 nm, and about 10 nm). Regarding the increase of the insertion loss which is one of the characteristics of SAW filters, the insertion-loss characteristic is deteriorated for the SiN film having a film-thickness of about 1 nm. Thus, for the standpoints of the moisture-proof property, the film-thickness is required to be at least about 3 nm. The SAW device having no SiN film is shown in FIGS. 4A to 4C.

The SAW devices used in the test of which the results are shown in FIGS. 3 and 5 have the IDTs 1b and the packages 2 produced according to the same specifications, respectively. The differences between the filter characteristics are due to the presence or absence of the SiN film 4 and also the different film-forming methods.

The ECR sputtering method has the following advantages. Electric charges are stored in a SAW device when the temperature thereof is increased or decreased during film-formation, due to the pyroelectric property. Thus, in some cases, an electrode of the SAW filter is broken (pyroelectric breakdown). To cope with this problem, the electrodes of the IDTs, which are opposed to each other and are not primarily electrically-connected, are connected through a node provided outside the device. The connection is cut immediately after the film-forming process is completed. However, the breakdown of the IDTs cannot completely been avoided, even if the above-described connection is provided. For this reason, methods such as ECR sputtering in which the number of heating processes is small or from which the heating processes can be omitted are advantageous for production of SAW devices.

When an $LiNbO_2$ substrate is used as the piezoelectric substrate, it is deteriorated at about 350° C. at which SiN is generally film-formed by the P-CVD method, and the insertion loss is increased. Accordingly, the P-CVD method can not be applied to $LiNbO_2$ substrates. On the other hand, according to the ECR sputtering method, the film-formation can be performed at a room temperature. This method can be also applied to $LiNbO_3$ substrates which are easily pyro-electrically broken.

In addition, the ECR sputtering method has further advantages. One of the advantages is the flatness of a protection film. The flatness of the protection film produced by the ECR sputtering method is higher than that obtained by the P-CVD method. The protection film is formed on the portion of the device where SAW is propagated, and exerts a great influence on the filter characteristic of the SAW device.

When a protection film is formed by the P-CVD method, pores (empty holes) are formed. The pores form large concavities and convexities, since the protection film is formed so as to have a uniform thickness on the electrodes and the substrate. Thus, the loss of SAW propagating on the concave and convex portions of the device becomes large.

On the other hand, with the protection film produced by the ECR sputtering method, formation of pores is prevented. The film is tight in structure and is tapered on the end portions of the electrodes. Accordingly, the flatness is improved, so that the loss of SAW propagating on the portion of the device where the protection film is formed is reduced compared to that of the protection film obtained by the P-CVD method.

Moreover, a silicon oxide film may be added onto the protection film. The addition of the silicon oxide film is effective for improving the resistance to environmental conditions of the device, and also, frequency-adjustment becomes possible. The silicon oxide film can be successively film-formed by the ECR sputtering method.

Figure 7:
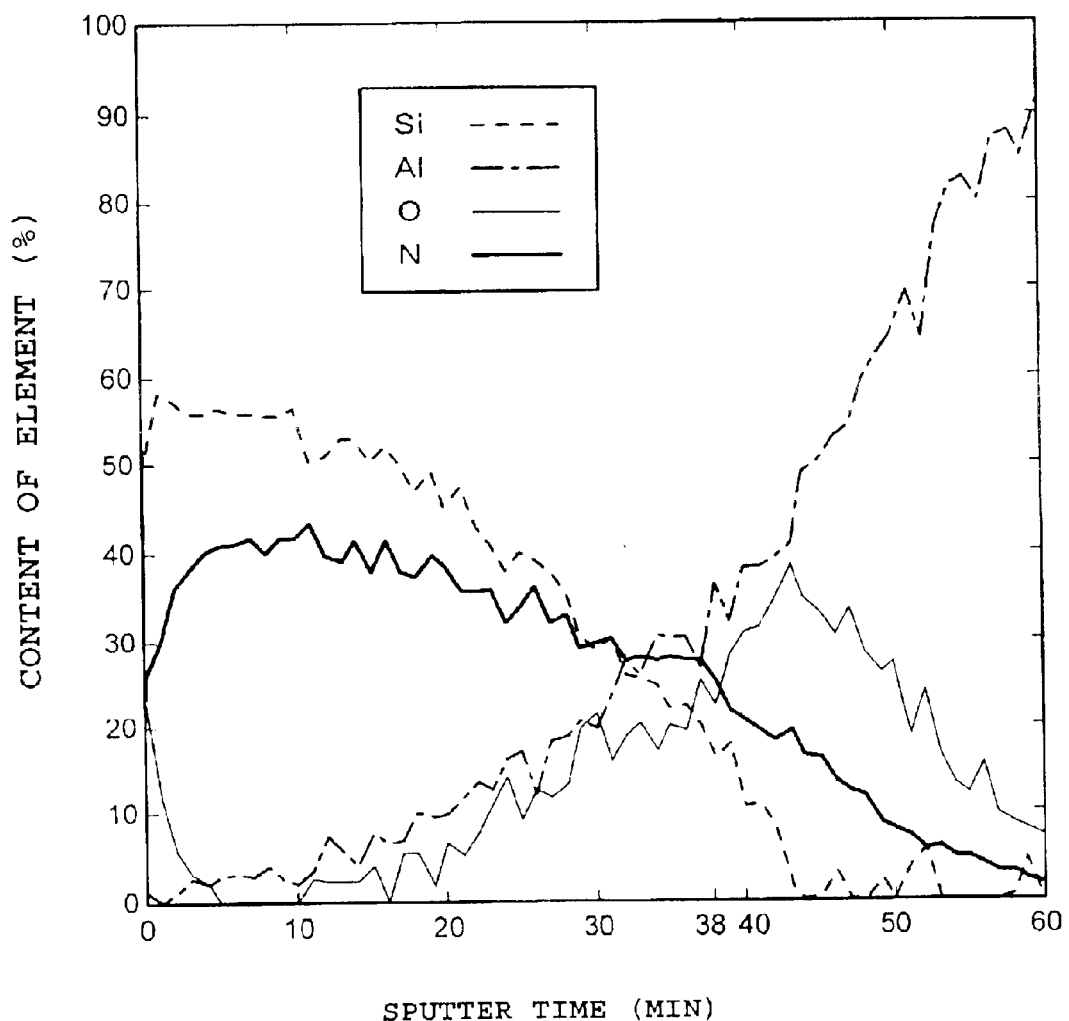
FIG. 7 is a graph showing the change of the contents of the elements in the film-thickness of the continuous film provided in the SAW filter.

Hereinafter, a second preferred embodiment will be described with reference to FIG. 7. In the second preferred embodiment, an SiO film, an SiON film, and an SiN film are laminated onto IDTs 1b in that order, instead of the SiN film 4. In particular, the continuously-changed film is formed as a protection film having the composition that is continuously changed and arranged to improve the resistance to environmental conditions of the device as well as in the first preferred embodiment of the present invention.

The continuously-changed film was formed under the following conditions.

TABLE 2

| Items | Film-forming condition |
| --- | --- |
| Ar gas flow rate (constant) | 40 sccm |
| $O_2$ gas flow rate (maximum) | 5 sccm |
| $N_2$ gas flow rate (maximum) | 10 sccm |
| Pressure at film-forming | $1.7 \times 10^{-1}$ Pa |
| Microwave and RF power | 500/500 |
| Heating of substrate | No heating |
| Film-thickness | — |
| Film-forming rate | 4 to 10 nm/min. |

TABLE 3

| Step | Time (min) | $N_2$ flow rate | $O_2$ flow rate |
| --- | --- | --- | --- |
| (1) | 0 to 20 | 0 | 5.0 |
| (2) | 20 to 25 | 2 | 2.0 |
| (3) | 25 to 30 | 4 | 1.0 |
| (4) | 30 to 40 | 6 | 0.5 |
| (5) | 40 to 42 | 8 | 0.2 |
| (6) | 42 to 45 | 10 | 0 |

Regarding the change of the gas flow rates shown in Table 3, the unit was sccm, and the flow rate of the Ar gas was constant, that is, about 40 sccm.

The film-forming rate in the step (1) was about 10 nm/min, and that in the step (6) was about 4 nm/min.

The continuously changed film with respect to an SiO film, an SiON film, and an SiN film was formed in the steps (1) to (6). The overall thickness was about 300 nm. The gas flow rates were continuously changed in the respective steps.

The concentrations (molar %) of the respective elements in the thickness direction of the continuously changed film were determined. FIG. 7 shows the results. This determination was carried out as follows. The continuously changed film was scraped off gradually from the surface side thereof by use of Ar gas or other suitable gas. The contents of the elements existing in the scraped portions of the continuously changed film were quantitatively determined, e.g., by atomic absorption and ICP analyses, and other methods.

The filter-characteristics of the SAW filter formed under the above-described conditions were measured, and were compared with that of the SAW filter having no continuously changed film (the contrast device was a 2 GHz band ladder filter). Substantially no deterioration of the characteristic was found.

The device was placed into a package sealed with a resin, and evaluated by a moisture-proof loading test (approximately 6V was loaded at about 60° C. and about 90% to about 95% RH (relative humidity)). The moisture-proof property was accepted by the 1000 hour test, and was found to be sufficient. The electrode after the test was observed. No peeling or cracking of the protection film was found.

TABLE 4

| Step | Time (min) | $N_2$ flow rate | $O_2$ flow rate | Refractivity |
|---|---|---|---|---|
| (1) | 0 to 20 | 0 | 5.0 | 1.46 |
| (2) | 20 to 25 | 2 | 2.0 | 1.49 |
| (3) | 25 to 30 | 4 | 1.0 | 1.6 |
| (4) | 30 to 40 | 6 | 0.5 | 1.73 |
| (5) | 40 to 42 | 8 | 0.2 | 1.86 |
| (6) | 42 to 45 | 10 | 0 | 1.97 |

Table 4 shows change of the gas flow rates and measurements of refractivity in the respective steps for film-formation (unit; sccm. Ar gas flow rate was constant, that is, about 40 sccm). The measurements of reflectivity were obtained at points in the continuously changed film. However, it can be seen that the reflectivity is changed substantially continuously from about 1.46 (SiO) to about 1.97 (SiN). Moreover, the lowermost layer was made of SiO, which improves the adhesion of the continuously changed film to the IDTs 1b.

Hereinafter, a third preferred embodiment of the present invention will be described. In the third preferred embodiment, a protection film for improving the moisture-proof property was a multi-layer film having a four-layer structure including an SiO lowermost layer, an SiN+SiO intermediate layer, and an SiN uppermost layer instead of the SiN film 4 of the first preferred embodiment of the present invention.

In this case, the film-formation was carried out under the following conditions.

TABLE 5

| Items | Film-forming condition |
|---|---|
| Ar gas flow rate (constant) | 40 sccm |
| $O_2$ gas flow rate (SiO) | 8 sccm |
| $N_2$ gas flow rate (SiN) | 10 sccm |
| Pressure at film-forming | $1.7 \times 10^{-1}$ Pa |
| Microwave and RF power | 500/500 |
| Heating of substrate | No heating |
| Film-thickness | Total 320 nm |
| Film-forming rate SiO | 10 nm/min |
| Film-forming rate SiN | 4 nm/min |

TABLE 6

| Steps | Time (min) | $N_2$ flow rate | $O_2$ flow rate |
|---|---|---|---|
| (1) | 0 to 15 | 0 | 8 |
| (2) | 15 to 18 | 10 | 0 |

TABLE 6-continued

| Steps | Time (min) | $N_2$ flow rate | $O_2$ flow rate |
|---|---|---|---|
| (3) | 18 to 33 | 0 | 8 |
| (4) | 33 to 36 | 10 | 0 |

A protection film was formed on the SAW device via the steps of from (1) to (4) so as to have a four-layer structure including the lowermost layer of SiO, the intermediate layers of SiN and SiO, respectively, and the uppermost layer of SiN. The filter-characteristic of the SAW filter formed under the above-described conditions was measured and compared to that of the device for comparison not provided with the protection film (a 2 GHz band ladder filter). Substantially no deterioration of the characteristic was found.

The device was placed into a package and sealed with a resin, and evaluated by a moisture-proof loading test (approximately 6V was loaded at about 60° C. and about 90% to about 95% RH (relative humidity)). The moisture-proof property was accepted by the 1000 hour test, and was found to be sufficient. The electrode after the test was observed. No peeling or cracking of the protection film was found.

As seen in the above-described preferred embodiments, according to the present invention, the ECR sputtering method is used, and accordingly, heating of the piezoelectric substrate 1a is not required. This results in no breaking of the electrode films such as the IDTs 1b and so forth, which may be caused by increases and decreases of the temperature thereof during formation of the protection film. Moreover, preferred embodiments of the present invention may be applied to materials such as lithium niobate ($LiNbO_3$), substrates of which the characteristics are changed by heating.

The above-described conditions for film-formation are shown by way of example. The gas flow rates may be changed to improve the film-forming rates. Moreover, the SAW device is described by way of example. The present invention is not restricted to the frequency band and the structure of the SAW filter 1. Furthermore, as above-described, the bump bonding is preferably used as an example. The present invention may be applied to a SAW device using wire bonding.

Figure 8:
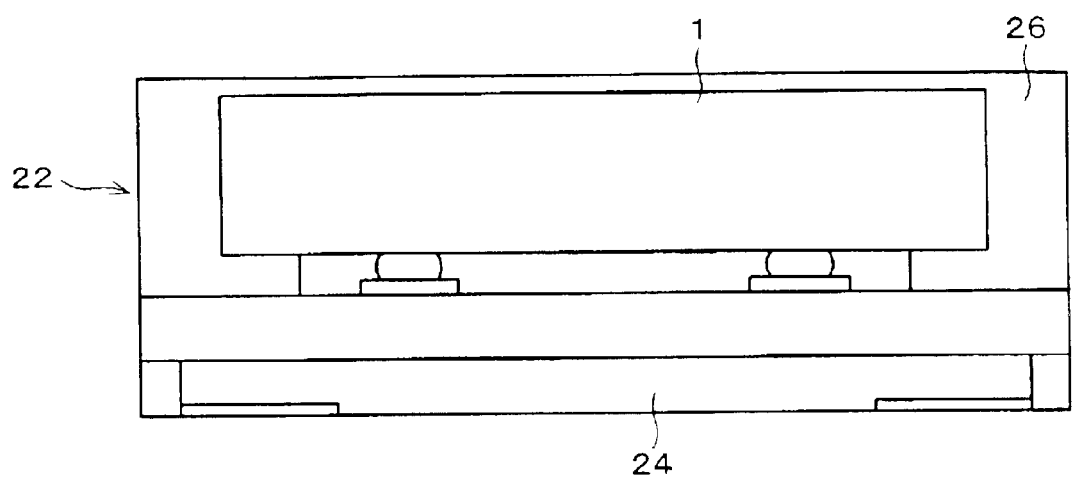
FIG. 8 is a schematic cross-sectional view of a modification of a package for the SAW filter.
Figure 9:
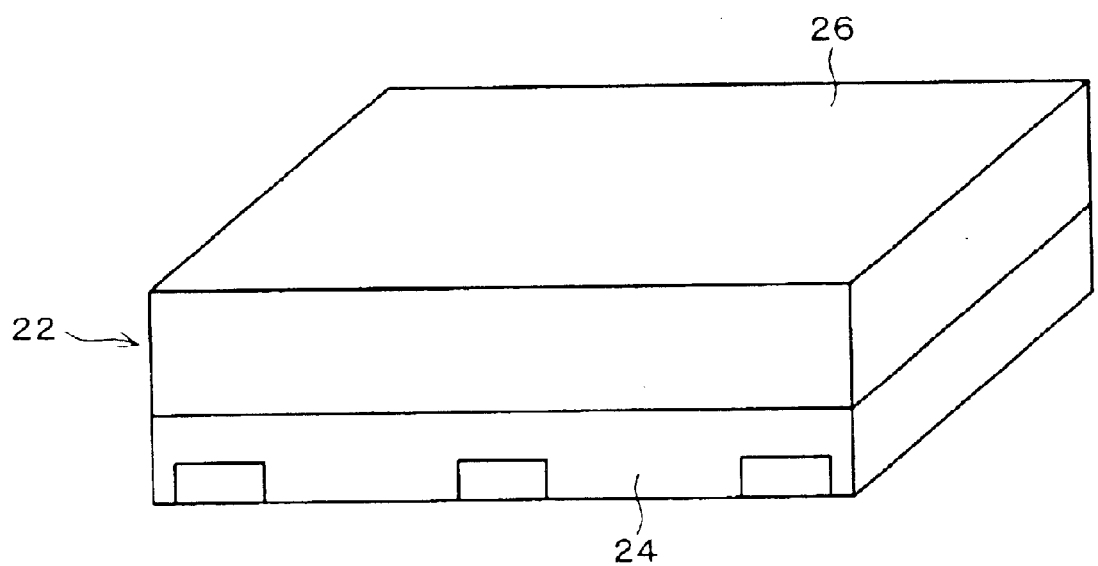
FIG. 9 is a perspective view of the package.

Moreover, in the above-described respective preferred embodiments, the case-shaped package 2 is typically used. However, this is not restrictive. For example, a chip-sized package 22 may be used as shown in FIGS. 8 and 9. In the chip-sized package 22, the SAW filter 1 is mounted onto a multi-layer substrate 24 by flip chip bonding, and thereafter, the SAW filter 1 placed on the substrate 24 is sealed with a sealing resin 26 in such a manner that the resin covers the filter 1. In this case, the sealing resin 26 is a moisture-permeable member through which steam can be permeated.

The surface acoustic wave device having the chip-sized package 22 is sealed with the moisture-permeable sealing resin 26 only. Accordingly, it is more difficult to protect the members such as the IDTs 1b, the input-output terminals 1c, the pad layers 1d, and so on which have influences onto the characteristics of the SAW filter 1, compared to the bottomed box-shaped package 2 shown in FIG. 1.

However, according to preferred embodiments of the present invention, the protection film (functional film) formed by the ECR sputtering method covers the overall surfaces of the IDTs 1b, the input-output terminals 1c, the pad layers 1d, and the piezoelectric substrate having these components formed thereon. Accordingly, the resistance to environmental conditions of the device is greatly improved, due to the tight-structure protection film (functional film) formed by the ECR sputtering method. The protection film is also formed on the portion of the piezoelectric substrate 1a of the SAW filter 1 where the piezoelectric substrate 1a is in contact with the sealing resin 26.

Therefore, according to preferred embodiments of the present invention, intrusion of water through the interface between the piezoelectric substrate 1a and the sealing resin 26 is reliably prevented. The weather resistance of the device is further improved.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A surface acoustic wave device comprising:

a piezoelectric substrate;

interdigital electrode portions disposed on the piezoelectric substrate;

a functional film including at least one of a silicon nitride film, a silicon oxide film, and a silicon oxide nitride film disposed on at least a portion of the interdigital electrode portions; and a package containing the piezoelectric substrate having the interdigital electrode portions and the functional film, at least a portion of the package being made of a moisture-permeable material; wherein the functional film is made of an electron cyclotron resonance sputtered material.

2. The surface acoustic wave device according to claim 1, wherein the package containing the piezoelectric substrate having the interdigital electrode portions and the functional film defines a structure on which the piezoelectric substrate is flip-chip bonded, and the piezoelectric substrate is sealed with a moisture-permeable resin.

3. The surface acoustic wave device according to claim 1, wherein the functional film is formed at room temperature.

4. The surface acoustic wave device according to claim 1, wherein the functional film includes the silicon nitride film, and the silicon nitride film has a film-thickness of about 3 nm or greater, and said film thickness is about 2.0% or less of the wavelength of a surface acoustic wave generated in the interdigital electrode portions.

5. The surface acoustic wave device according to claim 1, wherein the functional film includes a silicon oxide film defining a lowermost layer which is located on an electrode side, a silicon oxide nitride film defining an intermediate layer, and a silicon nitride film defining an uppermost layer.

6. The surface acoustic wave device according to claim 5, wherein the intermediate layer has a multi-layer structure in which at least one silicon nitride film and at least one silicon oxide film are laminated to each other.

7. A surface acoustic wave device comprising:

a piezoelectric substrate;

interdigital electrode portions disposed on the piezoelectric substrate;

a functional film including a silicon nitride film, the functional film being disposed on at least a portion of the interdigital electrode portions and made of an electron cyclotron resonance sputtered material; and a package containing the piezoelectric substrate having the interdigital electrode portions and the functional film, at least a portion of the package being made of a moisture-permeable material;

the functional film having a nitrogen concentration that varies in a film-thickness direction.

8. The surface acoustic wave device according to claim 7, wherein the functional film has a nitrogen concentration on a front surface side which is greater than that on an interdigital electrode portion side.

9. The surface acoustic wave device according to claim 7, wherein the functional film has a silicon oxide film for frequency-adjustment formed thereon.

* * * * *